US010660199B1

(12) United States Patent
Flowers et al.

(10) Patent No.: US 10,660,199 B1
(45) Date of Patent: May 19, 2020

(54) MICROFLUIDIC CHANNELS AND PUMPS FOR ACTIVE COOLING OF CIRCUIT BOARDS

(71) Applicant: Amazon Technologies, Inc., Seattle, WA (US)

(72) Inventors: Jonathan Barak Flowers, Edgware (GB); Herbert Mehnert, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/175,456

(22) Filed: Oct. 30, 2018

(51) Int. Cl.
| | | |
|---|---|---|
| *H05K 1/02* | (2006.01) | |
| *H05K 3/06* | (2006.01) | |
| *H05K 7/00* | (2006.01) | |
| *H05K 7/20* | (2006.01) | |
| *C12M 1/00* | (2006.01) | |
| *H05K 1/09* | (2006.01) | |
| *H01B 7/42* | (2006.01) | |

(52) U.S. Cl.
CPC .......... *H05K 1/0272* (2013.01); *H01B 7/423* (2013.01); *H05K 1/0201* (2013.01); *H05K 1/09* (2013.01); *H05K 2201/064* (2013.01); *H05K 2201/066* (2013.01); *H05K 2201/093* (2013.01); *H05K 2201/10083* (2013.01)

(58) Field of Classification Search
CPC .......... H05K 1/02; H05K 1/0272; H05K 7/00; H05K 7/20; H05H 3/101; H05H 3/06; C12M 1/00
USPC ................ 174/252; 361/696, 698, 699, 748; 435/287.1; 422/68.1, 502; 310/11, 328; 165/104.29, 104.31, 104.33
See application file for complete search history.

(56) References Cited

U.S. PATENT DOCUMENTS

| | | | | |
|---|---|---|---|---|
| 4,749,890 A | * | 6/1988 | Houston | .............. H02K 44/085 |
| | | | | 310/11 |
| 5,779,971 A | * | 7/1998 | Tsung Pan | ................. B41J 2/01 |
| | | | | 222/595 |
| 6,645,432 B1 | * | 11/2003 | Anderson | ............. B01L 3/0262 |
| | | | | 422/502 |
| 8,574,513 B2 | | 11/2013 | Chen et al. | |
| 9,716,313 B1 | * | 7/2017 | Mumcu | .................... H01Q 3/04 |
| 10,129,975 B1 | * | 11/2018 | Tabor | ................... H05K 1/0293 |
| 2004/0201323 A1 | * | 10/2004 | Wong | ................... G02B 6/3538 |
| | | | | 310/328 |
| 2006/0158849 A1 | * | 7/2006 | Martin | .................. H01L 23/473 |
| | | | | 361/699 |

(Continued)

FOREIGN PATENT DOCUMENTS

WO  2018178745 A1  10/2018

OTHER PUBLICATIONS

International Search Report and Written Opinion dated Dec. 12, 2019, on application No. PCT/US2019/055985.

*Primary Examiner* — Xiaoliang Chen

(74) *Attorney, Agent, or Firm* — Lowenstein Sandler LLP

(57) ABSTRACT

Microfluidic channels and pumps for active cooling of circuit boards are described. One circuit board includes a substrate and a microfluidic channel structure disposed on the substrate, the microfluidic channel structure comprising liquid metal disposed in a microfluidic channel. Liquid metal is disposed in the microfluidic channel and a pump pumps the liquid metal through the microfluidic channel to actively cool at least a portion of the circuit board.

19 Claims, 7 Drawing Sheets

(56) References Cited

U.S. PATENT DOCUMENTS

| | | | |
|---|---|---|---|
| 2009/0279257 A1* | 11/2009 | Lower | H05K 1/0272 |
| | | | 361/699 |
| 2009/0279259 A1* | 11/2009 | Cripe | H05K 1/0272 |
| | | | 361/699 |
| 2009/0308081 A1 | 12/2009 | Ouyang et al. | |
| 2010/0064518 A1* | 3/2010 | Lower | H01L 23/36 |
| | | | 29/890.039 |
| 2010/0064695 A1* | 3/2010 | Wilcoxon | F04B 17/00 |
| | | | 62/3.2 |
| 2010/0065256 A1* | 3/2010 | Wilcoxon | F28D 15/00 |
| | | | 165/104.31 |
| 2010/0066178 A1* | 3/2010 | Lower | H02K 44/04 |
| | | | 310/11 |
| 2011/0017431 A1 | 1/2011 | Yang et al. | |
| 2011/0043937 A1* | 2/2011 | Juncker | B01L 3/502738 |
| | | | 359/846 |
| 2011/0045577 A1* | 2/2011 | Bruzewicz | H05K 3/101 |
| | | | 435/287.1 |
| 2011/0171068 A1* | 7/2011 | Helvajian | B01J 19/0093 |
| | | | 422/68.1 |
| 2012/0092105 A1* | 4/2012 | Weinberg | H01F 5/00 |
| | | | 335/296 |
| 2013/0048254 A1* | 2/2013 | Livingston | H01L 23/427 |
| | | | 165/104.29 |
| 2014/0192218 A1* | 7/2014 | Jung | G02B 5/005 |
| | | | 348/222.1 |
| 2015/0070836 A1 | 3/2015 | Yairi et al. | |
| 2015/0075749 A1 | 3/2015 | Monfray et al. | |
| 2015/0351216 A1* | 12/2015 | Loewen | H05K 7/20272 |
| | | | 361/696 |
| 2016/0236390 A1* | 8/2016 | Franksson | B29C 45/73 |
| 2017/0028402 A1* | 2/2017 | Hishida | C12Q 1/686 |
| 2017/0150647 A1 | 5/2017 | Hyde et al. | |
| 2017/0367179 A1 | 12/2017 | Holbery et al. | |

* cited by examiner

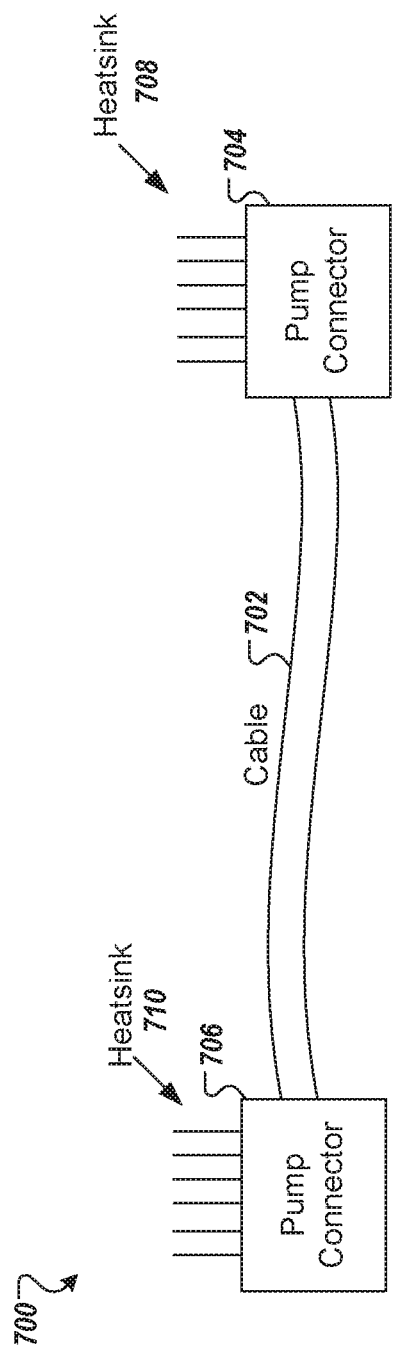
FIG. 7A
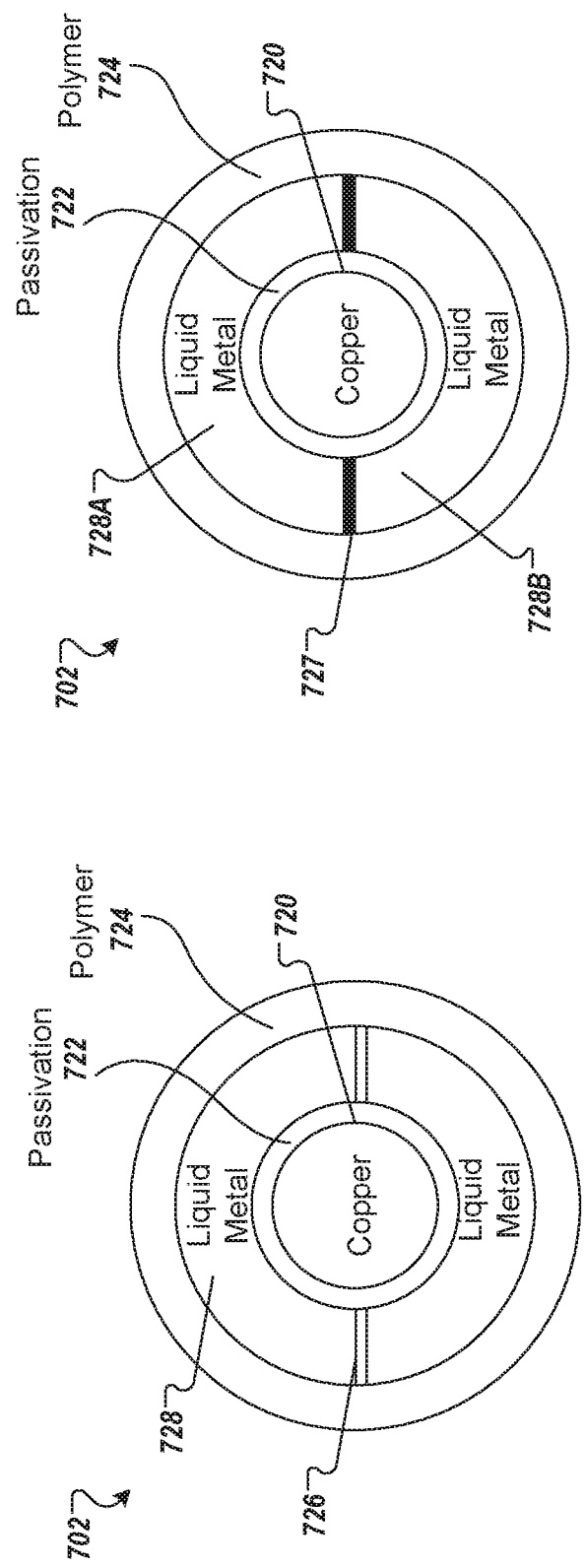
FIG. 7B
FIG. 7C

MICROFLUIDIC CHANNELS AND PUMPS FOR ACTIVE COOLING OF CIRCUIT BOARDS

BACKGROUND

Electronic devices generate heat during operation. Electronic devices typically include a circuit board and circuitry disposed on or within the circuit board. A heatsink can be used to dissipate heat from the circuitry to a cooling medium, such as air or a coolant. The heatsink allows the temperature of the circuitry to be regulated at appropriate levels for operation. In computers, heatsinks are used to cool one or more cores (processor cores, graphic cores, or the like) in one or more integrated circuits disposed on a circuit board. The heatsinks are mounted on the one or more integrated circuits to dissipate the heat from the integrated circuits during operation. Heatsinks can be used for other high-power semiconductor devices where heat dissipation is needed for proper operation. Heatsinks are designed to have large surface areas that are in contact with the cooling medium to dissipate the heat from the circuitry to the cooling medium. A fan can also be combined with the heatsink to further dissipate the heat away from the circuitry. A heatsink, which is usually made out of copper or aluminum, contributes to an overall size and cost of an electronic device, since the heatsink can be large in size as compared to the smaller circuitry that it is cooling.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 7A is a side view of a cable with a microfluidic channel structure coupled between a first pump connector and a second pump connector according to one embodiment.

FIG. 7B is a cross-sectional view of the cable with the microfluidic channel structure according to one embodiment.

FIG. 7C is a cross-sectional view of the cable with the microfluidic channel structure according to another embodiment.

DETAILED DESCRIPTION

Figure 1A:
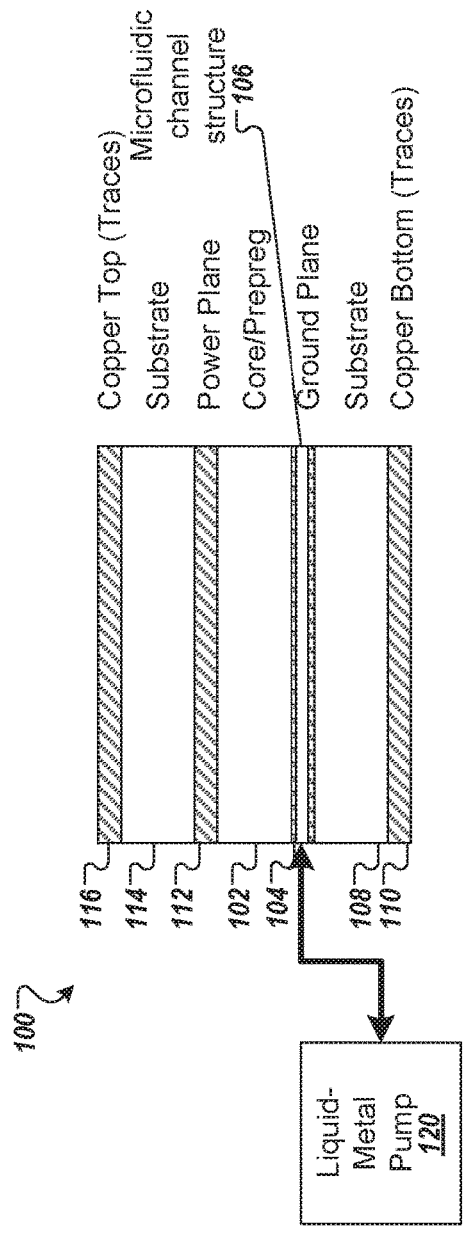
FIG. 1A is a side view of a circuit board having a microfluidic channel structure in a ground plane according to one embodiment.

Microfluidic channels and pumps for active cooling of circuit boards are described. One circuit board includes a substrate and a microfluidic channel structure disposed on the substrate, the microfluidic channel structure comprising liquid metal disposed in a microfluidic channel. Liquid metal is disposed in the microfluidic channel and a pump pumps the liquid metal through the microfluidic channel to actively cool at least a portion of the circuit board.

In flexible circuit board design, there is a concept of using flexible metal traces that allow the boards to bend. From that concept, a similar technique can be used to create a cooling system for circuit boards, the cooling system using liquid metal cooling in microfluidic channels in circuit boards, as well as liquid metal cooling for high current applications, such as cables with large copper wires. The microfluidic channels can be in rigid circuit boards, as well as flexible circuit boards. As described herein, material is transported through the microfluidic channels unlike designs where this material is static. For example, a trace can be made of liquid metal, but the liquid metal in the trace is static. That is the liquid metal in these designs is not actively moved in any way and is not used for transferring heat. The embodiments described herein actively move liquid metal through the microfluidic channel(s) to transfer heat for cooling portions of a circuit board, portions of a cable, or other high current applications. A conductive trace that is made up of liquid metal can be coupled to a pump to move the liquid metal through the microfluidic channel for active cooling applications. The conductive trace can be used for signaling in addition to active cooling in some embodiments. Just like copper can be used on a printed circuit board (PCB), a microfluidic channel can be created instead of that copper (or in addition to other copper traces). The microfluidic channel can be filled with liquid metal that can be pumped around and cool the trace for components connected to the trace at the same time as signaling to and from the component. The microfluidic channel can be implemented in a ground plane to actively cool a component, such as the entire circuit board or portions of a circuit board. In some cases, the liquid metal in the entire ground plane can be pumped to cool the circuit board. The heat can be conducted via the microfluidic channel and into a heatsink or other thermal radiator to radiate the transferred heat into a cooling medium. The microfluidic channel(s) in a circuit board can be manufactured using various processing techniques, such as etching, photolithography-based etching, engraving, mechanical engraving, molding, injection molding, casting, offset printing, or the like. In one embodiment of manufacturing, a rolling circuit pattern with die-drum can be used. Alternatively, the laminate and cure techniques can be used.

The embodiments described herein implement the cooling technique by using basic pumping mechanisms to move the fluid (i.e., liquid metal) through the channels. The designs of the circuit boards would include a new component, i.e., a microfluidic channel structure with one or more microfluidic channels. Also, the embodiments include a closed path for these liquids to flow. The closed path can be on a ground plane of the circuit board, but it can also be part of one or more discrete channels for targeted, cooling of components on or within the circuit board. These channels need to be closed so that there is a loop that the coolant can flow along. In the case of a ground plane, there is an exit to a radiator, such a radiator on the pump or a pump connector. This can operate like a large heat, but the radiator on the pump or pump connector can be smaller and more tightly integrated with the circuit board. This allows heat to be moved away from a component to another place on the circuit board more efficiently before being radiated away from the circuit board. The increased heat transfer from pumping the liquid metal through the liquid metal channel(s) can keep boards cooler and cooled more precisely. The increased heat transfer from pumping the liquid metal through the liquid metal channel(s) can save weight on oversized heatsinks.

The microfluidic channel can also be implemented as liquid-metal traces on conductive layers of a circuit board. Similar fluidic channels can also be implemented in a cable assembly in which the fluidic channel at least partially surrounds a conductor along a length of the conductor. As noted here, large wires heat up and require cooling when transferring high current. The liquid metal connectors for high power (high current) applications can use liquid metal to connect high power components instead of large diameter wires/traces. The liquid metal connection could be designed as a circuit and actively cooled. This can increase longevity of connections, safety of designs, and save weight on heavy copper wires used for these connections. In another application, liquid metal jackets can be used for cooling large diameter copper wires or stainless steel plated wires.

It should be noted that various embodiments describe microfluidic channels or fluidic channels. In other embodiments, other types of liquid metal channels can be used in connection with various pumping mechanisms to transfer heat from a first location to a second location through the liquid metal channel. Also, in some embodiments, the pump is outside of the circuit board or outside of the substrate and the pump mechanically moves the metal liquid through the channel. It can be said that the pump pushes the liquid metal along mechanically. In other embodiments, the pump uses electrostatic forces on the liquid metal. The pump in this case is not mechanically connected to the liquid metal channel. The pump may be an electrostatic pump, an electrohydrostatic pump, an electrostatic fluid accelerator (EFA), electro hydrodynamic pump, or other non-mechanical pumps. The pumping method depends on scale; for example, the pumping method can be electrostatic for small applications or peristaltic/systolic for larger applications.

As described herein, some embodiments of the liquid metal are Eutectic Gallium Indium (EGaIn) alloy, such as the Galinstan® alloy. EGaIn alloy can have various benefits, including, for example, a melting point of 15 degrees Celsius or lower; there is no change to electrical function when solid; when solid, the alloy is ductile; self-healing due to liquid and solid properties, and the like. The EGaIn alloy can be highly corrosive to other metals, so the liquid metal can be disposed in plastic, anodized metals, graphite/carbon/graphene or stainless steel. The EGaIn alloy can have a viscosity at 20 degrees Celsius of 0.0024 Pascal seconds, as compared to 0.00089 Pascal seconds for water. The Galinstan® alloy is 2.6 times more viscous than water. As such, the EGaIn alloys can be pumped, even with an electrostatic pump or other non-mechanical, electrical pump. EGaIn alloys are also not toxic. Although corrosive to other metals, EGaIn can be used with carbon (graphite), as EGaIn alloy won't corrode the carbon. Similarly, stainless steel can be used with EGaIn alloy. Chromium nickel, which has low thermal properties, can be plated very thin and used with EGaIn alloy. Mercury is another alloy that can be used but the main issue with mercury is toxicity.

FIG. 1A is a side view of a circuit board 100 having a microfluidic channel structure 106 in a ground plane according to one embodiment. The circuit board 100 includes multiple layers, including a first base layer 102 (e.g., a substrate, a core, a prepreg), a ground plane layer 104 disposed on a bottom side of the first base layer 102, a second base layer 108 (e.g., substrate, core, prepreg) disposed on a bottom side of the second layer 104, and a bottom layer 110 disposed on a bottom side of the second base layer 108, the bottom layer 110 having one or more conductive traces and active circuitry. The circuit board 100 also includes a power plane layer 112 disposed on a top side of the first base layer 102, a third base layer 114 disposed on a top side of the power plane layer 112, and a top layer 116 disposed on a top side of the third base layer 114, the top layer 116 having one or more conductive traces and additional active circuitry. The ground plane layer 104 includes conductive material that forms a ground plane of the circuit board 100. The ground plane layer 104 also includes a microfluidic channel structures 106 having liquid metal disposed in one or more microfluidic channels. A liquid-metal pump 120 is coupled to the one or more microfluidic channels. The liquid-metal pump 120 pumps the liquid metal through the one or more microfluidic channels. Motion of the liquid metal through the one or more microfluidic channels distributes heat through an entire surface of or a surface area of the ground plane to cool the circuit board 100. Alternatively, the motion of the liquid metal through the one or more microfluidic channels distributes heat away from certain portions of the circuit board 100, such as from one location to another location. For example, the active circuitry disposed on the top layer 116 or on the bottom layer 110 can generate heat and the motion of the liquid metal through the one or more microfluidic channels can be used to distribute the heat away from the active circuitry in an efficient manner.

The circuit board, in other embodiments, can be other multi-layer circuit boards that include at least one a top layer, a bottom layer, and one or more inner cores disposed between the top layer and the bottom layer. In one embodiment, a circuit board includes a base layer, a top layer, a second layer, a second base layer, a bottom layer, a third layer, and an inner layer core. The top layer is disposed on a first side of the base layer, the top layer including one or more conductive traces and active circuitry. The second layer is disposed on a second side of the base layer. The second layer includes conductive material that forms a ground plane of the circuit board and a microfluidic channel structure having liquid metal disposed in one or more microfluidic channels. The bottom layer is disposed on a first side of the second base layer, the bottom layer including one or more additional conductive traces and additional active circuitry. The third layer is disposed on a second side of the second base layer, the third layer including second conductive material that forms a power plane of the circuit board. The inner layer core is disposed between the ground plane and the power plane. In one embodiment, a liquid-metal pump is coupled to the one or more microfluidic channels and pumps the liquid metal through the one or more microfluidic channels. The motion of the liquid metal through the one or more microfluidic channels distributes heat through the ground plane to cool the circuit board. In a further embodiment, a second liquid-metal pump is coupled a liquid-metal trace in the top layer. The liquid-metal trace includes an inlet coupled to the second liquid-metal pump, an outlet coupled to the second liquid-metal pump, and a microfluidic channel disposed within the liquid-metal trace and coupled to the inlet and the outlet. Additional liquid metal is disposed in the microfluidic channel. The second liquid-metal pump pumps the additional liquid metal through the microfluidic channel of the liquid-metal trace. Motion of the additional liquid metal through the microfluidic channel transfers heat from a first location of the circuit board to a second location of the circuit board.

In one embodiment, the microfluidic channel structure 106 may include polymeric organosilicon material, thermoplastic polymer materials, or any combination thereof. For example, the microfluidic channel structure 106 includes Polydimethylsiloxane (PDMS) and Poly(methyl methacrylate) (PMMA). PDMS is in a group of polymeric organosilicon compounds (also referred to as silicones) and is more commonly used than other silicon-based organic polymers. PDMS is optically clear, non-toxic, non-flammable and is known for its flow properties. PMMA is an acrylic or acrylic glass that is transparent thermoplastic. PMMA can be an alternative to glass. In other embodiments, the microfluidic channel structure 106 may be made of sub-polymers, polycarbonates (PC), or the like. Polycarbonates are polymers containing carbonate groups in there chemical structures. Polycarbonates are strong and can be optically transparent and can be molded, thermoformed or easily worked into shapes.

In one embodiment, the liquid metal is eutectic alloy including at least gallium and indium. In another embodiment, the liquid metal is eutectic alloy including at least gallium, indium, and tin The liquid metal may be Eutectic Eutectic Gallium Indium (EGaIn) alloy, such as the Galinstan® liquid alloy that is a eutectic alloy of gallium, indium, and tin.

Additional details of the liquid metal, the liquid-metal pumps, and the microfluidic channel structures are described below with respect to FIG. 2A-2B.

Figure 1B:
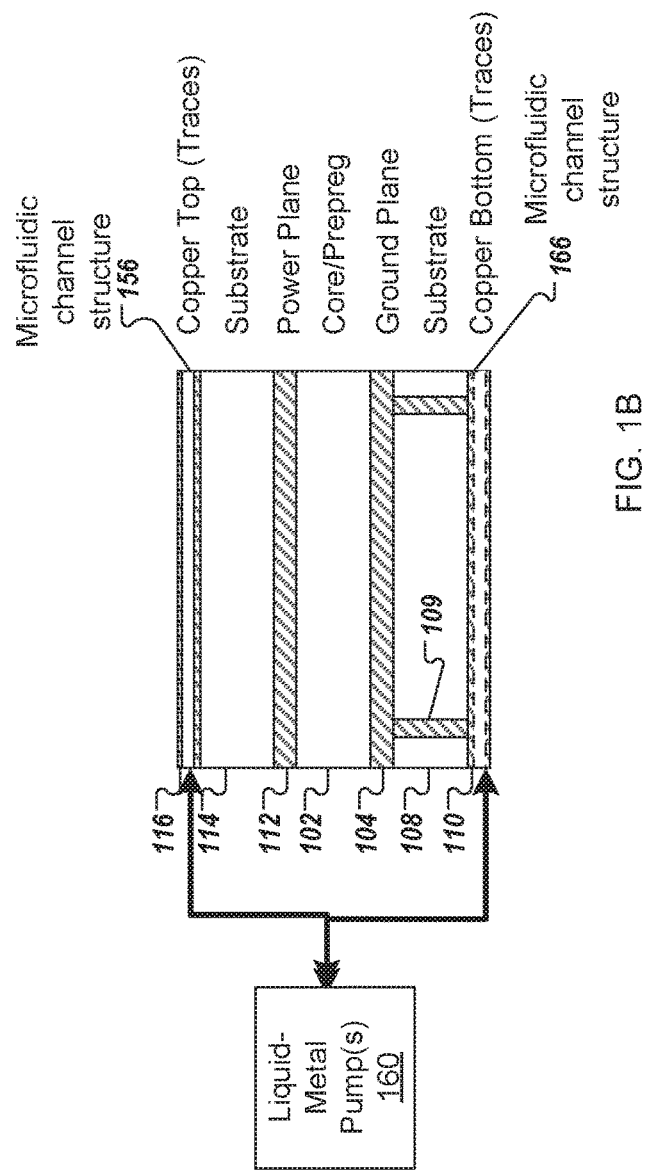
FIG. 1B is a side view of a circuit board having a first microfluidic channel structure in a top layer and a second microfluidic channel structure in a bottom layer according to one embodiment.

FIG. 1B is a side view of a circuit board 150 having a first microfluidic channel structure 156 in a top layer and a second microfluidic channel structure 166 in a bottom layer according to one embodiment. The circuit board 150 includes the same layers as the circuit board 100 as noted by similar reference numbers. Unlike the circuit board 100, the circuit board 150 includes the first microfluidic channel structure 156 in the top layer 116 and the second microfluidic channel structure 166 in a bottom layer 110. In a further embodiment, the microfluidic channel structure 106 could also be disposed in the ground plane layer 104 as described above with respect to FIG. 1A. The first microfluidic channel structure 156 includes one or more microfluidic channels in which liquid metal is disposed. The second microfluidic channel structure 166 includes one or more microfluidic channels in which liquid metal is disposed. One or more liquid pumps 160 are coupled to the one or more microfluidic channels of the first microfluidic channel structure 156 and to the one or more microfluidic channels of the second microfluidic channel structure 166. The one or more liquid-metal pumps 160 pump the liquid metal through the one or more microfluidic channels. Motion of the liquid metal through the one or more microfluidic channels of the microfluidic channel structure 156 distributes heat through the top layer 116, such as from one location of the circuit board 150 to another location of the circuit board 150. For example, the active circuitry disposed on the top layer 116 (or on the bottom layer 110) can generate heat and the motion of the liquid metal through the one or more microfluidic channels can be used to distribute the heat away from the active circuitry in an efficient manner.

In one embodiment, the first and second microfluidic channel structures 156, 166 may include polymeric organosilicon material, thermoplastic polymer materials, or any combination thereof, such as described above. In one embodiment, the liquid metal is eutectic alloy including at least gallium, indium, and tin. The liquid metal may be EGaIn alloy (e.g., Galinstan® liquid alloy).

In another embodiment, a first liquid-metal pump is coupled to the first microfluidic channel structure 156 and a second liquid-metal pump is coupled to the second microfluidic channel structure 166. The first microfluidic channel structure 156 and the second microfluidic channel structure 166 can liquid-metal traces. The liquid-metal traces can be coupled to inlets and outlets of the respective liquid-metal pumps. A microfluidic channel is disposed within the liquid-metal trace and coupled to the inlet and the outlet of the respective liquid-metal pump. The first liquid-metal pump pumps liquid metal through the first liquid-metal trace in the top layer 116 and the second liquid-metal pump pumps liquid metal through the second liquid-metal trace in the bottom layer 110. The motion of the liquid metal through the respective microfluidic channel transfers heat from a first location of the circuit board to a second location of the circuit board as a targeted cooling system.

In other embodiments, one or more vias 109 can be disposed between two or more layers of the circuit board 150. For example, as illustrated, two vias 109 are disposed between the ground plane layer 104 and the bottom layer 110. The vias 109 can be copper (or other standard PCB materials) that extend through the circuit board 150 to transfer heat from the ground plane layer 104 to the microfluidic channels of the microfluidic channel structure 166 in the bottom layer 110. The heat can then be distributed through the bottom layer 110 through the microfluidic channel structure 166. Although two vias 109 are illustrated between these two specific layers, in other embodiments, one or more vias can be used between other layers.

Additional details of the liquid metal, the liquid-metal pumps, and the microfluidic channel structures are described below with respect to FIG. 2A-2B.

Figure 2A:
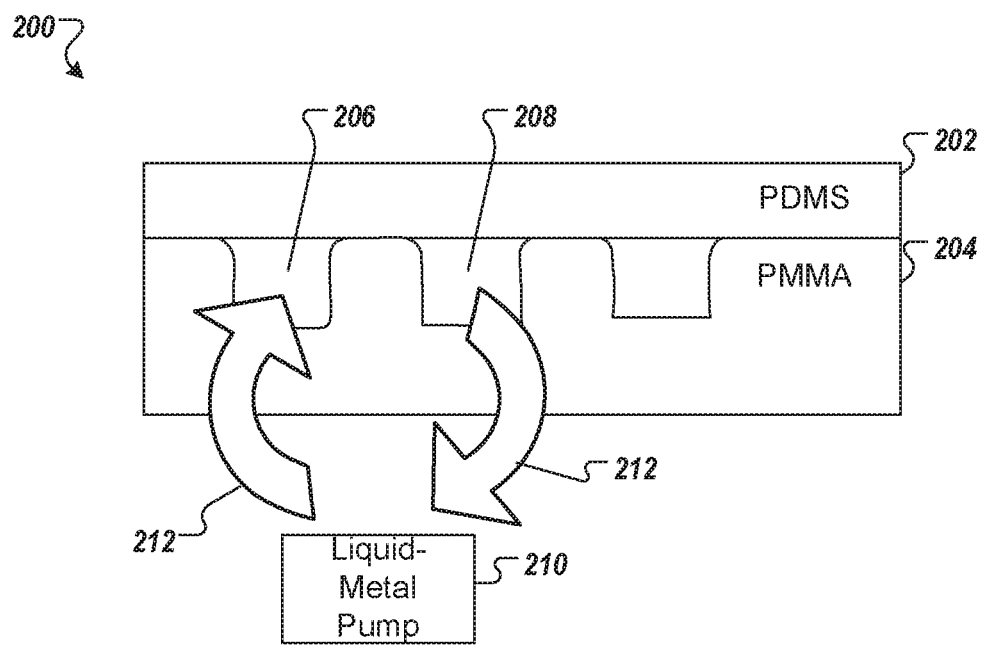
FIG. 2A is a side view of a microfluidic channel structure according to one embodiment.

FIG. 2A is a side view of a microfluidic channel structure 200 according to one embodiment. The microfluidic structure 200 can be made of a PDMS layer 202 and a PMMA layer 204. In the PMMA layer 204, one or more microfluidic channels can be created, such as a first microfluidic channel 206 and a second microfluidic channel 208. The first microfluidic channel 206 can be coupled to an outlet of a liquid-metal pump 210 and the second microfluidic channel 208 can be coupled to an inlet of the liquid-metal pump 210 to facilitate flow 212 of the liquid metal within the first microfluidic channel 206 and the second microfluidic channel 208. The PDMS layer 202 can be fabricated with microfluidic channel patterns, such as by hot embossing or the processing techniques. The PDMS layer 202 can be bonded or otherwise coupled to the PMMA layer 204.

Figure 2B:
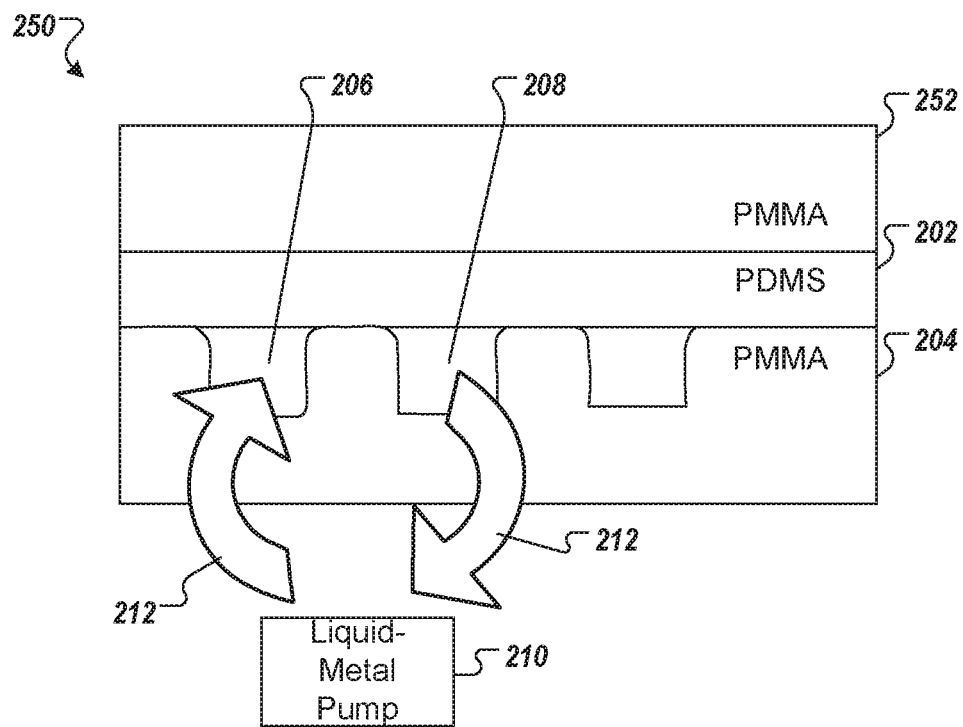
FIG. 2B is a side view of a microfluidic channel structure according to another embodiment.

FIG. 2B is a side view of a microfluidic channel structure 250 according to another embodiment. The microfluidic structure 250 can be made of the PDMS layer 202, the PMMA layer 204, and another PMMA layer 252. In the PMMA layer 204, one or more microfluidic channels can be created, such as a first microfluidic channel 206 and a second microfluidic channel 208. The first microfluidic channel 206 can be coupled to an outlet of a liquid-metal pump 210 and the second microfluidic channel 208 can be coupled to an inlet of the liquid-metal pump 210 to facilitate flow 212 of the liquid metal within the first microfluidic channel 206 and the second microfluidic channel 208. The PMMA layer 252 may be a bare substrate and the PDMS layer 202 can be spun on the bare substrate and partially cured. The PDMS layer 202 can be fabricated with microfluidic channel patterns, such as by hot embossing or the processing techniques. The two PMMA layers 204, 252 can be bonded together and the microfluidic channels can be sealed.

In other embodiments, the microfluidic channel structures can be created using other semiconductor processing techniques.

As described herein, the microfluidic channel structure can be one or more liquid-metal traces, embedded or otherwise disposed in an intermediate layer of a printed circuit board, such as a ground plane layer or a power plane layer. The microfluidic channel structure can also be disposed in a cable, as described in various embodiments below.

Figure 3:
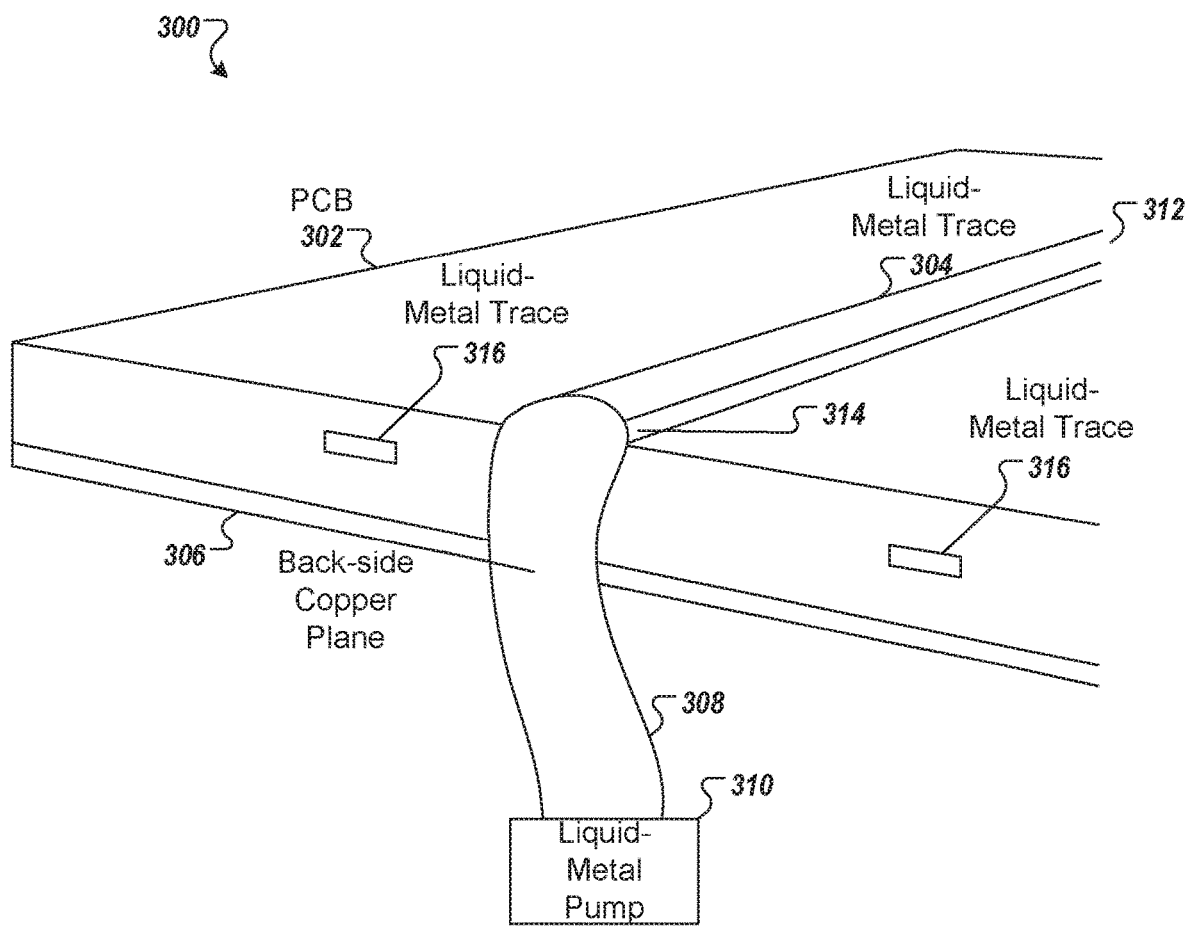
FIG. 3 is a perspective view of a semiconductor device 300 including a liquid-metal trace on a top layer of a printed circuit board according to one embodiment.

FIG. 3 is a perspective view of a semiconductor device 300 including a liquid-metal trace 304 on a top layer of a printed circuit board (PCB) 302 according to one embodiment. The semiconductor device 300 includes a backside copper plane 306 disposed on a bottom side of the PCB 302 and the liquid-metal trace 304 is disposed on a top side of the PCB 302. The liquid-metal trace 304 is a microfluidic channel structure with one or more microfluidic channels. The liquid-metal trace 304 is coupled to a liquid-metal pump 310 via tubing 308. The tubing 308 may include one or more channels in which the liquid metal can be pumped by the liquid-metal pump 310 through the one or more microfluidic channels in the liquid-metal trace 304. The motion of the liquid metal through the liquid-metal trace 304 can distribute heat from a first location 312 to a second location 314. A heatsink can be disposed on the liquid-metal pump 310 to radiate the transferred heat.

In the depicted embodiment, the liquid-metal pump 310 is illustrated off of the PCB 302. In other embodiments, the liquid-metal pump 310 can be disposed on or within the PCB 302, on or within the semiconductor device 300.

In another embodiment, a circuit board includes a substrate and a microfluidic channel structure disposed on the substrate. The microfluidic channel structure includes liquid metal disposed in a microfluidic channel. A pump is coupled to the microfluidic channel structure and pumps the liquid metal through the microfluidic channel to actively cool at least a portion of the circuit board. In one embodiment, such as illustrated in FIG. 1A, the microfluidic channel structure is disposed in a ground plane of the circuit board. The motion of the liquid metal through the microfluidic channel distributes heat through the ground plane to cool the circuit board, such as through an entire surface of the ground plane or targeted locations of the circuit board. In another embodiment, the microfluidic channel structure is a liquid-metal trace, such as illustrated in FIG. 3. Motion of the liquid metal through the microfluidic channel transfers heat from a first location of the circuit board to a second location of the circuit board as a targeted cooling system.

In another embodiment, inlet tubing is coupled to a first end of the microfluidic channel and outlet tubing is coupled to a second end of the microfluidic channel. The pump can be a mechanical pump that mechanically pumps the liquid metal through the microfluidic channel. The mechanical pump may be a peristaltic/systolic pump that mechanically pumps the liquid metal through the microfluidic channel. The pump may be a non-mechanical pump in other embodiments. In another embodiment, the pump is an electrostatic pump, an electrostatic fluid accelerator (EFA), or the like that uses an electric field to move the liquid metal through the microfluidic channel. In another embodiment, the pump is an electromagnetic pump that moves the liquid metal using electromagnetism. For example, a magnetic field is set at right angles to the direction the liquid moves in and current is passed through it. The magnetic field causes an electromagnetic force that moves the liquid through the microfluidic channel. It should be noted that in these embodiments the liquid metal has magnetic properties. As described herein, the liquid metal can be a eutectic alloy having at least gallium, indium, and tin, such as EGaIn alloy, the Galinstan® liquid alloy, or the like.

As described herein, the microfluidic channel structures can be used in connection with heatsinks. In one embodiment, a heatsink is disposed on the pump at a location. The heatsink dissipates heat away from the circuit board at the location. In another embodiment, a first heatsink is disposed on the pump at a first location and a second heatsink is disposed on a second location of the circuit board. The first heatsink dissipates heat away from the circuit board at the first location and the second heatsink dissipates heat away from the circuit board at a second location.

In another embodiment, the PCB 302 includes a base layer, a first layer disposed on a first side of the base layer. The first layer includes one or more conductive traces, a liquid-metal trace, and active circuitry. Liquid metal is disposed in a microfluidic channel of the liquid-metal trace. A liquid-metal pump is operatively coupled to the liquid-metal trace. At least a first portion of the liquid-metal trace is disposed near the active circuitry. The liquid-metal pump is configured to pump the liquid metal through the microfluidic channel to transfer heat away from the active circuitry to a second portion of the liquid-metal trace. A heatsink is operatively coupled to the second portion of the liquid-metal trace to dissipate heat away from the second portion of the liquid-metal trace to a cooling medium (e.g., air, coolant, or other fluid medium. In a further embodiment, one or more heatsinks are operatively coupled to one or more additional portions of the liquid-metal trace to dissipate heat away from the respective portions to the cooling medium. For example, a second heatsink is operatively coupled to a third portion of the liquid-metal trace to dissipate heat away from the third portion of the liquid-metal trace to the cooling medium. The pump can be a mechanical pump or a non-mechanical pump, as described herein.

In other embodiments, one or more liquid-metal traces 316 can be disposed within one or more layers of the PCB 302. The liquid-metal traces 316 can be similar to the liquid-metal trace 304 that is disposed on the PCB 302, except the liquid-metal traces 316 are embedded with one or more layers of the PCB 302. The liquid-metal trace(s) 316 can be coupled to the liquid-metal pump 310. Alternatively, the liquid-metal trace(s) 316 can be coupled to one or more separate liquid-metal pumps (not illustrated in FIG. 3).

It should be noted that the circuit boards described herein may be rigid circuit boards, such as PCBs with FR4 material or other rigid materials. In other embodiment, the circuit boards may be flexible circuit boards.

Figure 4:
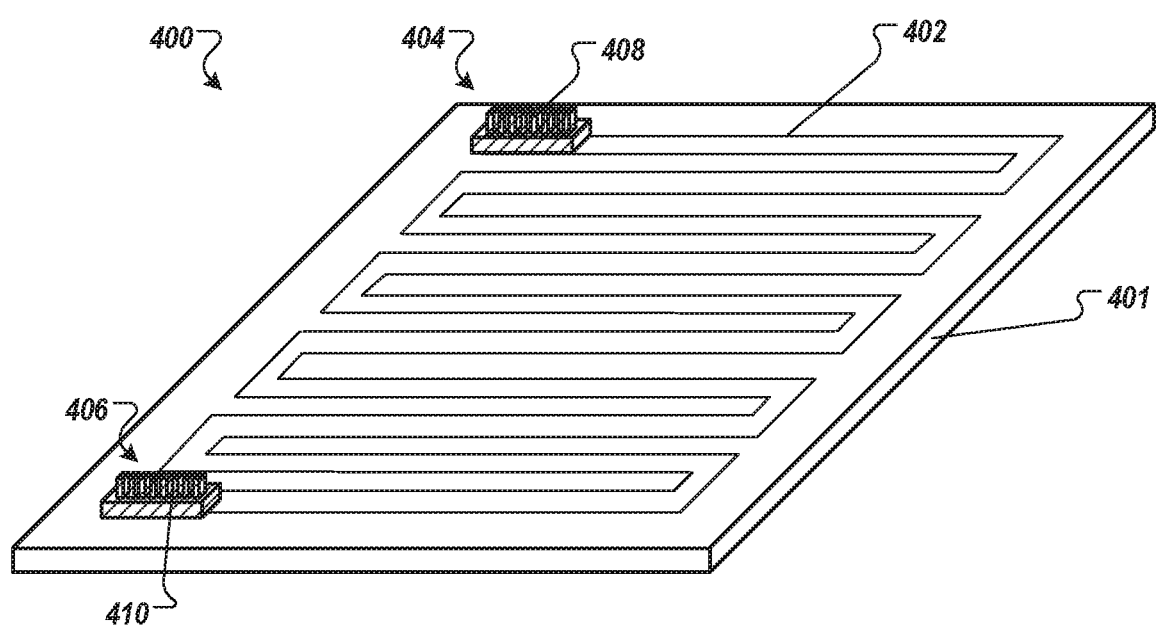
FIG. 4 is a perspective view of a semiconductor device having a liquid-metal trace in a loop between a first pump connector and a second pump connector according to one embodiment.

FIG. 4 is a perspective view of a semiconductor device having a liquid-metal trace in a loop between a first pump connector and a second pump connector according to one embodiment. The semiconductor device 400 includes a circuit board 401 with one or more layers; although only one layer is illustrated. The circuit board 401 has a first layer upon which is disposed a liquid-metal trace 402. The liquid-metal trace 402 is a microfluidic channel structure with one or more microfluidic channels. The liquid-metal trace 402 is coupled to a liquid-metal pump (not illustrated) via a first pump connector 404 and a second pump connector 406. A first heatsink 408 is disposed on the first pump connector 404 and a second heatsink 410 is disposed on the second pump connector 406. The liquid-metal pump can pump liquid metal through the first and second pump connectors 404, 406 to the liquid-metal trace 402. As illustrated, the liquid-metal trace 402 includes multiple sections that extend back and forth over a surface area of the circuit board 401. The motion of the liquid metal through the liquid-metal trace 402 can distribute heat away from the circuit board 401 using the pump and the heatsinks 408, 410. The heatsinks 408, 410 can be disposed on the first and second pump connectors 404, 406, respectively to radiate heat away from the circuit board 401. As illustrated, the liquid-metal trace 402 can be used to cool a surface area of the circuit board 401. In other embodiments, the liquid-metal trace 402 can be disposed in other patterns on the circuit board to selectively cool one or more portions of the circuit board 401.

Figure 5A:
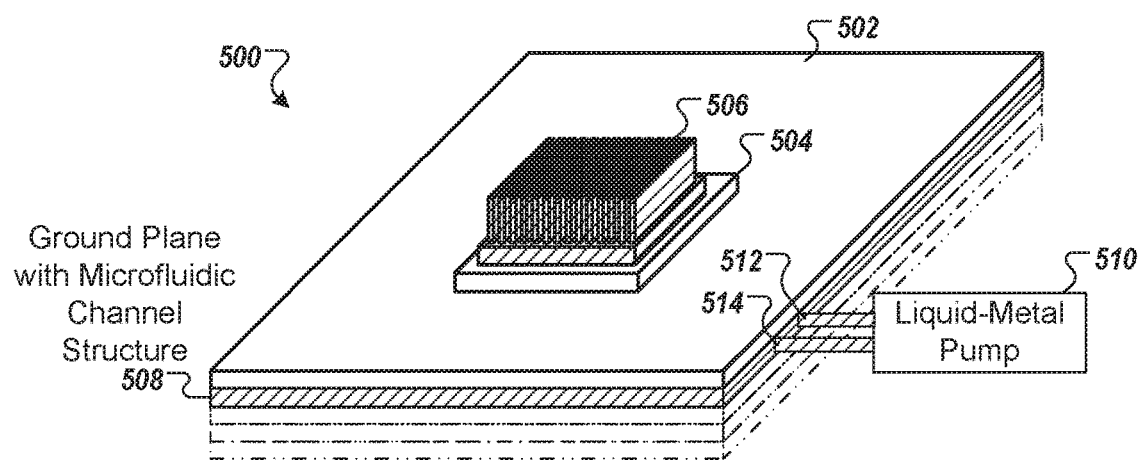
FIG. 5A is a perspective view of a circuit board having an integrated circuit with a heatsink and a ground plane with a microfluidic channel structure coupled to a liquid-metal pump according to one embodiment.

FIG. 5A is a perspective view of a circuit board 500 having an integrated circuit 504 with a heatsink 506 and a ground plane with a microfluidic channel structure 508 coupled to a liquid-metal pump 510 according to one embodiment. The circuit board 500 may include one or more layers, including a first layer 502 upon which the integrated circuit 504 is disposed. In a second layer, the ground plane with the microfluidic channel structure 508 is disposed. The ground plane with the microfluidic channel structure 508 includes one or more microfluidic channels in which liquid metal can be pumped. The ground plane with the microfluidic channel structure 508 is coupled to the liquid-metal pump 510 via tubing 512 and tubing 514. A heatsink 506 can be disposed on the integrated circuit 504. In another embodiment, an additional heatsink is disposed on pump connectors or the liquid-metal pump 510 to radiate additional heat away from the circuit board 500. The liquid-metal pump 510 can pump liquid metal through the tubing 512, 514 to the microfluidic channels of the ground plane with the microfluidic channel structure 508. As illustrated, the microfluidic channel structure 508 can cover an entire surface area of the ground plane of the circuit board 500 to cool the circuit board 500. The motion of the liquid metal through the ground plane with the microfluidic channel structure 508 can distribute heat away from the circuit board 500 using the liquid-metal pump 510 and the heatsink 506. The heatsink 506 can be smaller than a design that does not use the liquid-metal pump 510 and the microfluidic channel structure 508. As illustrated, the ground plane with the microfluidic channel structure 508 can be used to cool a surface area of the circuit board 500. In other embodiments, the ground plane with the microfluidic channel structure 508 can be disposed in various patterns on the circuit board to selectively cool one or more portions of the circuit board 500. As described herein, the liquid-metal pump 510 can be a mechanical pump that pumps the metal liquid through the tubing 512, 514. In other embodiments, the liquid metal can be pump using non-mechanical pumps without the use of tubing 512, 514.

Figure 5B:
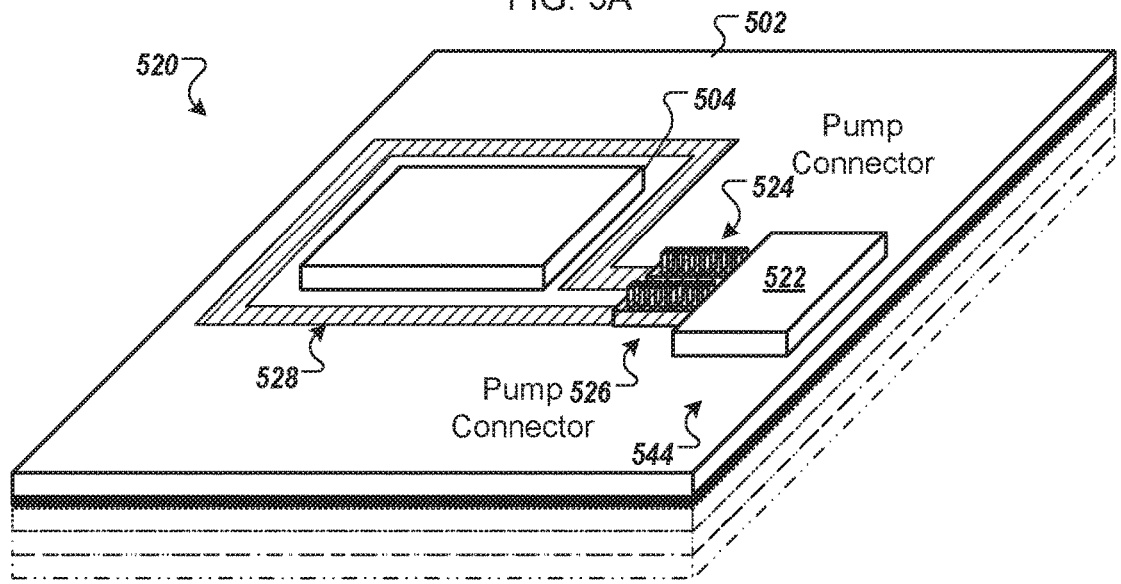
FIG. 5B is a perspective view of a circuit board having an integrated circuit and a liquid-metal loop trace coupled to a liquid-metal pump according to one embodiment.

FIG. 5B is a perspective view of a circuit board 520 having an integrated circuit 504 and a liquid-metal loop trace 528 coupled to a liquid-metal pump 522 disposed on the circuit board 520 according to one embodiment. The circuit board 520 may include one or more layers, including a first layer 502 upon which the integrated circuit 504 is disposed. The second layer may or may not include the ground plane with the microfluidic channel structure 508 as described above with respect to FIG. 5A. The liquid-metal loop trace 528 includes one or more microfluidic channels in which liquid metal can be pumped. The liquid-metal loop trace 528 is coupled to the liquid-metal pump 522 via a first pump connector 524 and a second pump connector 526. A first heatsink is disposed on the first pump connector 524 and a second heatsink is disposed on the second pump connector 526. The liquid-metal pump 522 is disposed on the first layer 502 and can pump liquid metal through the first and second pump connectors 524, 526, to the microfluidic channels of the liquid-metal loop trace 528. As illustrated, the liquid-metal loop trace 528 can completely or partially surround a specific area of the circuit board 520, such as an area that surrounds the integrated circuit 504. The liquid-metal loop trace 528 can transfer heat away from this area in which the integrated circuit 504 is disposed. Alternatively, one or more additional liquid-metal traces can be used to cool other portions of the circuit board 520. The motion of the liquid metal through the liquid-metal loop trace 528 can distribute heat away from the circuit board 520 using the liquid-metal pump 522. As illustrated, the liquid-metal loop trace 528 can be used to cool a surface area of a portion of the circuit board 520. In other embodiments, the liquid-metal loop trace 528 can be disposed in various patterns on the circuit board to selectively cool one or more portions of the circuit board 520. As described herein, the liquid-metal pump 522 can be a mechanical pump or a non-mechanical pump.

Figure 5C:
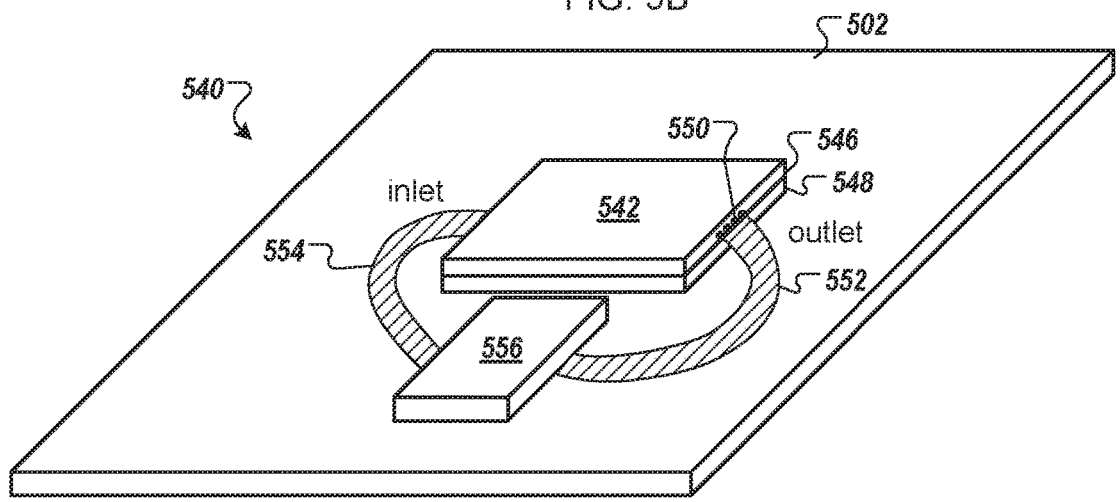
FIG. 5C is a perspective view of a circuit board having a microfluidic channel structure coupled to a liquid-metal pump according to one embodiment.

FIG. 5C is a perspective view of a circuit board 540 having a microfluidic channel structure 542 coupled to a liquid-metal pump 556 according to one embodiment. The circuit board 540 may include one or more layers, including a first layer 502 upon which the microfluidic channel structure 542 is disposed. The microfluidic channel structure 542 includes one or more microfluidic channels 550 between at least two layers 546, 548, through which liquid metal can be pumped. As described above with respect to FIGS. 2A-2B, the two layers 546, 548 may be a PMMA layer and a PDMS layer. The microfluidic channel structure 542 is coupled to the liquid-metal pump 556 via inlet tubing 554 and outlet tubing 552. One or more heatsinks can be disposed on the liquid-metal pump 556 or on other portions of the circuit board 540. The liquid-metal pump 556 is disposed on the first layer 502 and can pump liquid metal through the microfluidic channels 550 of the microfluidic channel structure 542. As illustrated, the microfluidic channel structure 542 can completely or partially surround a specific area of the circuit board 540, such as an area that surrounds a component, an integrated circuit, or the like. The microfluidic channel structure 542 can transfer heat away from this area. Alternatively, one or more additional microfluidic channel structures can be used to cool other portions of the circuit board 540. The motion of the liquid metal through the microfluidic channels 550 of the microfluidic channel structure 542 can distribute heat away from the circuit board 540 using the liquid-metal pump 556. As described herein, the liquid-metal pump 556 can be a mechanical pump or a non-mechanical pump.

Figure 6A:
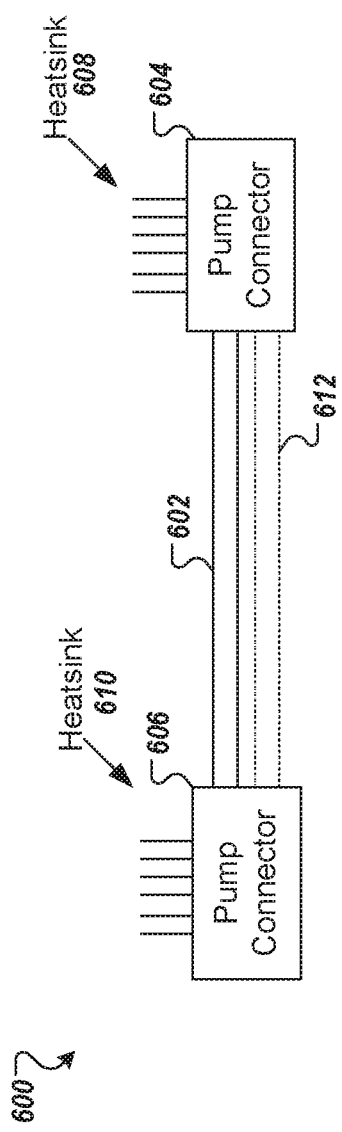
FIG. 6A is a side view of a microfluidic channel structure coupled between a first pump connector and a second pump connector according to one embodiment.

FIG. 6A is a side view 600 of a fluidic channel structure 602 coupled between a first pump connector 604 and a second pump connector 606 according to one embodiment. The first pump connector 604 is coupled between the fluidic channel structure 602 and a liquid-metal pump (not illustrated in FIG. 6A). The second pump connector 606 is coupled between the fluidic channel structure 602 and the liquid-metal pump or a second liquid metal pump (not illustrated in FIG. 6B). The liquid-metal pump is configured to pump liquid metal through one or more fluidic channels of the fluidic channel structure 602. Motion of the liquid metal through the fluidic channel structure 602 distributes heat away from at least a portion of the circuit board or other active circuitry. As described above, portions of a circuit board or other circuitry can increase in temperature and the fluidic channel structure 602 and liquid-metal pump can be used to cool those portions of the circuit board or other circuitry. The heat produced by active circuitry can be dissipated by the fluidic channel structure 602. For example, the liquid-metal pump pumps the liquid metal through the fluidic channel structure 602 to transfer the heat to one or both of the first pump connector 604 and the second pump connector 606. The fluidic channel can be any type of channel in which liquid metal can flow, such as metallo fluidic channels. A heatsink 608 can be disposed on the first pump connector 604. The heatsink 608 radiates heat transferred to the first pump connector 604 into a cooling medium (e.g., air or a coolant). A heatsink 610 can be disposed on the second pump connector 606. The heatsink 610 radiates heat transferred to the second pump connector 604 into the cooling medium. In another embodiment, a second fluidic channel structure 612 can be coupled between the first pump connector 604 and the second pump connector 606.

It should be noted that in addition to distributing heat away from at least a portion of the circuit board or other active circuitry, the fluidic channel structure 602 can be used as a conductor, such as for signaling. That is, the liquid metal in the fluidic channel structure 602 can be used to conduct a signal as well.

Figure 6B:
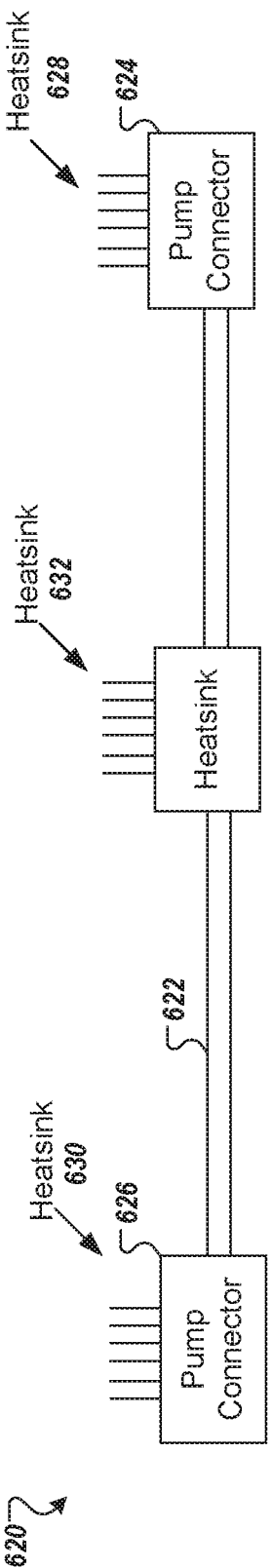
FIG. 6B is a side view of a microfluidic channel structure coupled between a first pump connector and a second pump connector and an intervening heatsink according to one embodiment.

FIG. 6B is a side view 620 of a fluidic channel structure 622 coupled between a first pump connector and a second pump connector and an intervening heatsink according to one embodiment. The first pump connector 624 is coupled between the fluidic channel structure 622 and a liquid-metal pump (not illustrated in FIG. 6B). The second pump connector 626 is coupled between the fluidic channel structure 622 and the liquid-metal pump or a second liquid-metal pump (not illustrated in FIG. 6B). The liquid-metal pump is configured to pump liquid metal through one or more fluidic channels of the fluidic channel structure 662. Motion of the liquid metal through the fluidic channel structure 622 distributes heat away from at least a portion of the circuit board or other active circuitry. As described above, portions of a circuit board or other circuitry can increase in temperature and the fluidic channel structure 622 and liquid-metal pump can be used to cool those portions of the circuit board or other circuitry. The heat produced by active circuitry can be dissipated by the fluidic channel structure 622. For example, the liquid-metal pump pumps the liquid metal through the fluidic channel structure 622 to transfer the heat to one or both of the first pump connector 624 and the second pump connector 626. A heatsink 628 can be disposed on the first pump connector 624. The heatsink 628 radiates heat transferred to the first pump connector 624 into a cooling medium (e.g., air or a coolant). A heatsink 630 can be disposed on the second pump connector 626. The heatsink 630 radiates heat transferred to the second pump connector 624 into the cooling medium. A third heatsink 632 can be disposed at a location between the first pump connector 624 and the second pump connector 626. The heatsink 632 radiates heat transferred along the fluidic channel structure 622 at a location other than the pump connectors.

Figure 6C:
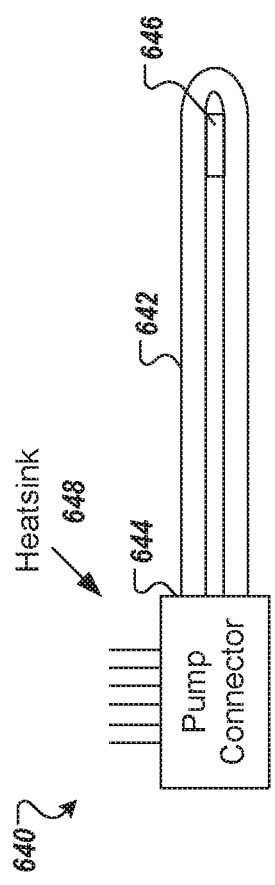
FIG. 6C is a side view of a microfluidic channel structure coupled to a pump connector according to one embodiment.

FIG. 6C is a side view 640 of a fluidic channel structure 642 coupled to a single pump connector 644 according to one embodiment. The singe pump connector 644 is coupled to two ends of the fluidic channel structure 642 and a liquid-metal pump (not illustrated in FIG. 6C). The liquid-metal pump is configured to pump liquid metal through one or more fluidic channels of the fluidic channel structure 642. Motion of the liquid metal through the fluidic channel structure 642 distributes heat away from another component 646, such as an inductor coil. As described above, portions of a circuit board or other circuitry can increase in temperature and the fluidic channel structure 642 and liquid-metal pump can be used to cool those portions of the circuit board or other circuitry. The heat produced by active circuitry can be dissipated by the fluidic channel structure 642. For example, the liquid-metal pump pumps the liquid metal through the fluidic channel structure 642 to transfer the heat to the single pump connector 644. A heatsink 648 can be disposed on the single pump connector 644. The heatsink 648 radiates heat transferred to the single pump connector 644 into a cooling medium (e.g., air or a coolant).

The embodiments described above are directed to fluidic channel structures used in connection with circuit boards. Also, described herein, are embodiments directed to the use of fluidic channel structures in connection with cables. In particular, the embodiments described below cover fluidic channel structures and pumps for active cooling of cables. High power components can be connected with large diameter copper wires or traces. The large wires heat up and require cooling when transferring high currents. Using the fluidic channel structures and a pump, a conductor of a cable for high power applications can be actively cooled by liquid metal flowing through a fluidic channel near the conductor. The motion of liquid metal in the fluidic channel transfers heat away from the conductor. The suggested liquid metal is the EGaIn alloy. This can increase longevity of connections, safety of designs, and save weight on heavy copper.

In one embodiment, a cable assembly includes a cable having a conductor with a length between a first end of the cable and a second end of the cable. A fluidic channel structure surrounds the conductor along the length of the cable. The fluidic channel includes a passivation layer, a polymer layer, and a support structure. The passivation layer can surround the conductor along the length of the conductor. Here the passivation layer can be used to prevent corrosion, but also can operate as a portion of a channel. In other embodiments, there is no passivation layer, but some other layer to serve as the portion of the channel. The polymer layer surrounds the passivation layer along the length of the conductor. The support structure is disposed between the passivation layer and the polymer. The passivation layer, the polymer layer, and the support structure form a fluidic channel surrounding the conductor along the length of the cable. A first pump connector is coupled to a first end of the fluidic channel structure, the first end of the fluidic channel structure corresponding to the first end of the cable. A second pump connector is coupled a second end of the fluidic channel structure, the second end of the fluidic channel structure corresponding to the second end of the cable. A liquid-metal pump is coupled to at least of the first pump connector or the second pump connector. The liquid-metal pump pumps liquid metal through the fluidic channel. Motion of the liquid metal through the fluidic channel distributes heat away from the conductor.

In a further embodiment, a first portion of the fluidic channel structure forms a first liquid-metal channel partially surrounding an upper portion of the passivation layer and a second portion of the fluidic channel structure forms a second liquid-metal channel partially surrounding a lower portion of the passivation layer. In another embodiment, a first heat sink coupled to the first pump connector and a second heat sink coupled to the second pump connector. In a further embodiment, the first pump connector includes an inlet coupled between the first end of the fluidic channel and an output of the liquid-metal pump. The second pump connector comprises an outlet coupled between the second end of the fluidic channel and an input of the liquid-metal pump. Alternatively, other pump configurations are possible as described herein, such as a non-mechanical pump that distributes the liquid metal non-mechanically through the cable.

FIG. 7A is a side view 700 of a cable 702 with a fluidic channel structure coupled between a first pump connector 704 and a second pump connector 706 according to one embodiment. The cable 702 includes a conductor having a length between a first end of the cable 702 and a second end of the cable 702. The fluidic channel structure at least partially surrounds the conductor along the length of the conductor. The first pump connector 704 is coupled between the fluidic channel structure and a liquid-metal pump (not illustrated in FIG. 7A). The liquid-metal pump is configured to pump liquid metal through one or more fluidic channels of the fluidic channel structure. Motion of the liquid metal through the fluidic channel distributes heat away from at least a portion the conductor. As described above, as high current passes through the conductor, heat is produced. The heat produced from the conductor can be dissipated by the fluidic channel structure disposed or otherwise integrated within the cable. For example, the liquid metal pumped through the fluidic channel structure transfers the heat to one or both of the first pump connector 704 and the second pump connector 706. A heatsink 708 can be disposed on the first pump connector 704. The heatsink 708 radiates heat transferred to the first pump connector 704 into a cooling medium (e.g., air or a coolant). A heatsink 710 can be disposed on the second pump connector 706. The heatsink 710 radiates heat transferred to the second pump connector 706 into the cooling medium. In another embodiment, a second cable (not illustrated in FIG. 7A) can be coupled between the first pump connector 704 and the second pump connector 706.

It should be noted that in addition to distributing heat away from at least a portion of the conductor, the fluidic channel structure can be used as a conductor, such as for signaling. That is, the liquid metal in the fluidic channel structure can be used to conduct a signal as well.

FIG. 7B is a cross-sectional view of the cable 702 with the fluidic channel structure according to one embodiment. In the depicted embodiment, the cable 702 includes a conductor 720 and the fluidic channel structure. The fluidic channel structure within the cable 702 includes a passivation layer 722 surrounding the conductor 720 along the length of the conductor 720, a polymer layer 724 surrounding the passivation layer 722 along the length of the conductor 720 and a support structure 726 to create a fluidic channel 728 between the passivation layer 722 and the polymer layer 724.

Liquid metal is disposed in the fluidic channel 728 and pumped through the cable 702 with a liquid-metal pump (not illustrated). The liquid-metal pump may be mechanical pump or a non-mechanical pump, as described herein. The liquid metal may be a eutectic alloy, including, for example, at least gallium and indium. The liquid metal may be Eutectic Gallium Indium (EGaIn) alloy, such as the Galinstan® liquid alloy. The conductor 720 can be copper, the passivation layer 722 can be a metal oxide material, and the polymer layer 724 can be polymeric organosilicon material. Alternatively, the conductor 720, the passivation layer 722, and the polymer layer 724 can be other materials.

In another embodiment, a cable assembly includes a conductor having a length between a first end of the cable and a second end of the cable and a fluidic channel structure that at least partially surrounds the conductor along the length of the conductor. The cable assembly may further includes a first pump connector coupled to a first end of the fluidic channel structure and a second pump connector coupled to a second end of the fluidic channel structure. In another embodiment, the cable assembly includes a single pump connector coupled to one or more both ends of the cable. Motion of liquid metal, when pumped through the fluidic channel structure, distributes heat away from the conductor.

In one embodiment, the fluidic channel structure includes at least two layers that create a fluidic channel. The two layers can be a passivation layer surrounding the conductor along the length of the conductor and a polymer layer surrounding the passivation layer along the length of the conductor. Between the two layers there can be a support structure to create the fluidic channel between the passivation layer and the polymer layer.

In another embodiment, the fluidic channel structure includes a support structure to create multiple fluidic channels between the passivation layer and the polymer layer, such as illustrated in FIG. 7C.

FIG. 7C is a cross-sectional view of the cable 702 with a fluidic channel structure according to another embodiment. The fluidic channel structure within the cable 702 in FIG. 7C also includes the passivation layer 722 surrounding the conductor 720 along the length of the conductor 720, the polymer layer 724 surrounding the passivation layer 722 along the length of the conductor 720 and a support structure 727 to create a first fluidic channel 728A that partially surrounds an upper portion of the passivation layer 722 and a second fluidic channel 728B that partially surrounds a lower portion of the passivation layer 722. The support structure 727 is configured to separate the first fluidic channel from the second fluidic channel. The two fluidic channels can be connected to the same or different liquid-metal pumps to pump the liquid metal through the fluidic channels between the passivation layer 722 and the polymer layer 724. In one embodiment, a first portion of the fluidic channel structure forms a first liquid-metal channel partially surrounding an upper portion of the passivation layer 722 and a second portion 728B of the fluidic channel structure forms a second liquid-metal channel partially surrounding a lower portion of the passivation layer 722.

In another embodiment, the cable 702 is coupled to the first pump connector 704 and the second pump connector 706. In a further embodiment, the first pump connector 704 includes an inlet coupled between the first end of the fluidic channel and an output of the liquid-metal pump. The second pump connector includes an outlet coupled between the second end of the fluidic channel and an input of the liquid-metal pump. In a further embodiment, the pump is or includes a mechanical pump and inlet tubing is coupled to a first end of the fluidic channel and outlet tubing is coupled to a second end of the fluidic channel. The mechanical pump can be a peristaltic/systolic pump. In another embodiment, inlet tubing and the outlet tubing can be coupled to one or more pump connectors or to one or more liquid-metal pumps. Alternatively, other pump configurations are possible as described herein, such as a non-mechanical pump that distributes the liquid metal non-mechanically through the cable 702. In another embodiment, a pump with an output is coupled to the first pump connector and an input is coupled to the second pump connector.

In another embodiment, the liquid-metal pump is or includes a non-mechanical pump. The non-mechanical pump is to pump the liquid metal through the fluidic channel using at least one of electrostatic forces, electromagnetic forces, electrohydraulic forces, or Electrohydrostatic forces. The pump may be an electromagnetic pump that moves the liquid metal using electromagnetism. A magnetic field is set at right angles to the direction the liquid moves in, and a current is passed through it. This causes an electromagnetic force that moves the liquid. In another embodiment, the non-mechanical pump is at least one of an electrostatic pump or electrostatic fluid accelerator (EFA). The EFA uses an electric field to propel or otherwise move the liquid metal through the fluidic channel.

Liquid metal is disposed in the first fluidic channel 728A and the second fluidic channel 728B and pumped through the cable 702 with a liquid-metal pump (not illustrated). The liquid-metal pump may be mechanical pump or a non-mechanical pump, as described herein. The liquid metal may be a eutectic alloy, including, for example, at least gallium, indium, and tin. The liquid metal may be Eutectic Gallium Indium (EGaIn) alloy, such as the Galinstan® liquid alloy. The conductor 720 can be copper, the passivation layer 722 can be a metal oxide material, and the polymer layer 724 can be polymeric organosilicon material (e.g., PDMS). Alternatively, the conductor 720, the passivation layer 722, and the polymer layer 724 can be other materials. The passivation layer 722 can be stainless steel or other protective material, such as metal oxides, to create a shell against corrosion. The passivation layer can be manufactured using micro-coating, created by a chemical reaction with the base material, or allowed to be built from spontaneous oxidation.

In another embodiment, the fluidic channel structure can be liquid-metal jackets for cooling large diameter copper or stainless steel plated, or copper wires. There are many grades of Stainless Steels, Nickel Alloys, Titanium, Copper, Brass, Bronze, Cobalt, Nitinol, Aluminum, Carbon & Alloys Steels, Tantalum, Controlled Expansion, Rare, Clad, Electroplated that can used as materials for the cable. The embodiments described herein can be used in connection with these various types of materials.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present invention as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A circuit board comprising:
   a substrate;
   a microfluidic channel structure disposed on the substrate, the microfluidic channel structure comprising liquid metal disposed in a microfluidic channel; and a pump coupled to the microfluidic channel structure, wherein the pump is to pump the liquid metal through the microfluidic channel to actively cool at least a portion of the circuit board, wherein the microfluidic channel structure is disposed in a ground plane of the circuit board.

2. The circuit board of claim 1, wherein the microfluidic channel structure is a liquid-metal trace.

3. The circuit board of claim 1, further comprising:
inlet tubing coupled to a first end of the microfluidic channel; and
outlet tubing coupled to a second end of the microfluidic channel, wherein the pump is a mechanical pump that mechanically pumps the liquid metal through the microfluidic channel.

4. The circuit board of claim 3, wherein the mechanical pump is a peristaltic/systolic pump.

5. The circuit board of claim 1, wherein the pump is an electrostatic pump that uses an electric field to move the liquid metal through the microfluidic channel.

6. The circuit board of claim 1, wherein the pump is an electromagnetic pump that moves the liquid metal using electromagnetism.

7. The circuit board of claim 1, wherein the liquid metal is a eutectic alloy comprising at least gallium and indium.

8. The circuit board of claim 1, wherein the liquid metal is a Eutectic Gallium Indium (EGaIn) alloy.

9. The circuit board of claim 1, further comprising:
a heatsink disposed at a location on the pump, the heatsink to dissipate heat away from the circuit board at the location on the pump.

10. The circuit board of claim 1, further comprising:
a first heatsink disposed at a first location on the pump, the first heatsink to dissipate heat away from the circuit board at the first location on the pump; and
a second heatsink disposed at a second location on the pump, the second heatsink to dissipate heat away from the circuit board at the second location on the pump.

11. The circuit board of claim 1, wherein the liquid metal is a eutectic alloy or a Eutectic Gallium Indium (EGaIn) alloy, wherein the eutectic alloy comprises at least gallium and indium.

12. An apparatus comprising:
a circuit board comprising:
a substrate;
a component disposed at a first location; and
a microfluidic channel structure disposed on the substrate, the microfluidic channel structure comprising a microfluidic channel formed in at least one of polymeric organosilicon material or thermoplastic polymer material; and
a pump coupled to the microfluidic channel structure, wherein the pump is to pump liquid metal through the microfluidic channel, wherein the liquid metal, when pumped through the microfluidic channel during operation of the component, transfers heat originating from the component at the first location through the microfluidic channel structure to a second location of the circuit board, wherein the microfluidic channel structure is disposed in a ground plane of the circuit board.

13. The apparatus of claim 12, wherein the microfluidic channel structure is a liquid-metal trace.

14. The apparatus of claim 12, further comprising:
inlet tubing coupled to a first end of the microfluidic channel; and
outlet tubing coupled to a second end of the microfluidic channel, wherein the pump is a peristaltic/systolic pump that mechanically pumps the liquid metal through the microfluidic channel.

15. The apparatus of claim 12, wherein the liquid metal is a eutectic alloy comprising at least gallium and indium.

16. The apparatus of claim 12, wherein the liquid metal is a Eutectic Gallium Indium (EGaIn) alloy.

17. An apparatus comprising:
a circuit board comprising:
a substrate;
a component disposed at a first location; and
a microfluidic channel structure disposed on the substrate, the microfluidic channel structure comprising Polydimethylsiloxane (PDMS) and Poly(methyl methacrylate) (PMMA), wherein a microfluidic channel is formed in PMMA; and
a ground plane disposed on a first side of the substrate, wherein the microfluidic channel structure is disposed on a second side of the substrate; and
a via disposed between the ground plane on the first side of the substrate and the microfluidic channel structure on the second side of the substrate; and
a pump coupled to the microfluidic channel structure to move liquid metal through the microfluidic channel, wherein the liquid metal, when pumped through the microfluidic channel during operation of the component, transfers heat originating from the component at the first location through the microfluidic channel structure away from the component at the first location.

18. A circuit board comprising:
a substrate
a microfluidic channel structure disposed on the substrate, the microfluidic channel structure comprising Polydimethylsiloxane (PDMS) and Poly(methyl methacrylate) (PMMA), wherein a microfluidic channel is formed in PMMA; and
a pump coupled to the microfluidic channel structure to move liquid metal through the microfluidic channel to transfer heat away from at least a first portion of the circuit board, wherein the microfluidic channel structure comprises:
a first PMMA layer;
a second PDMS layer; and
a third PMMA layer.

19. The circuit board of claim 18, wherein the liquid metal is a eutectic alloy or a Eutectic Gallium Indium (EGaIn) alloy, wherein the eutectic alloy comprises at least gallium and indium.

* * * * *